United States Patent
Chavan et al.

(10) Patent No.: US 9,147,689 B1
(45) Date of Patent: Sep. 29, 2015

(54) METHODS OF FORMING FERROELECTRIC CAPACITORS

(71) Applicant: Micron Technology, Inc., Boise, ID (US)

(72) Inventors: Ashonita A. Chavan, Boise, ID (US); Durai Vishak Nirmal Ramaswamy, Boise, ID (US); Qian Tao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/254,327

(22) Filed: Apr. 16, 2014

(51) Int. Cl.
| | |
|---|---|
| *H01L 21/02* | (2006.01) |
| *H01L 27/115* | (2006.01) |
| *H01L 49/02* | (2006.01) |
| *H01L 21/265* | (2006.01) |
| *H01L 21/223* | (2006.01) |

(52) U.S. Cl.
CPC ...... *H01L 27/11507* (2013.01); *H01L 21/2236* (2013.01); *H01L 21/265* (2013.01); *H01L 28/55* (2013.01); *H01L 28/60* (2013.01)

(58) Field of Classification Search
USPC .......... 257/295, E43.001–E43.007, 257/E27.005–E27.006, E27.008, E29.164, 257/E29.167, E29.272, E29.323, E27.104, 257/E21.436, E21.663–E21.665; 438/3, 438/785, E21.208; 365/145
See application file for complete search history.

(56) References Cited

U.S. PATENT DOCUMENTS

| | | | |
|---|---|---|---|
| 6,773,930 B2 | 8/2004 | Summerfelt et al. | |
| 6,812,510 B2 | 11/2004 | Horii et al. | |
| 7,378,329 B2 | 5/2008 | Nakazawa et al. | |
| 7,390,678 B2 | 6/2008 | Wang et al. | |
| 7,709,359 B2 | 5/2010 | Boescke et al. | |
| 7,772,014 B2 | 8/2010 | Udayakumar et al. | |
| 8,304,823 B2 | 11/2012 | Boescke | |
| 2003/0179617 A1* | 9/2003 | Gudesen et al. | 365/200 |
| 2006/0263977 A1* | 11/2006 | Kim et al. | 438/253 |

* cited by examiner

*Primary Examiner* — Dao H Nguyen
*Assistant Examiner* — Tram H Nguyen
(74) *Attorney, Agent, or Firm* — Wells St. John, P.S.

(57) ABSTRACT

A method of forming a ferroelectric capacitor includes forming inner conductive capacitor electrode material over a substrate. After forming the inner electrode material, an outermost region of the inner electrode material is treated to increase carbon content in the outermost region from what it was prior to the treating. After the treating, ferroelectric capacitor dielectric material is formed over the treated outermost region of the inner electrode material. Outer conductive capacitor electrode material is formed over the ferroelectric capacitor dielectric material.

30 Claims, 3 Drawing Sheets

METHODS OF FORMING FERROELECTRIC CAPACITORS

TECHNICAL FIELD

Embodiments disclosed herein pertain to methods of forming ferroelectric capacitors.

BACKGROUND

One component used in integrated circuitry is a capacitor. Such a component includes at least two electrical conductors separated by a dielectric. Energy may be electrostatically stored in an electric field within the dielectric.

Memory is one type of integrated circuitry which may include capacitors. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

One type of non-volatile memory is ferroelectric random access memory (FeRAM). Individual memory cells in FeRAM may include a ferroelectric capacitor. These capacitors have ferroelectric dielectric material as at least part of the capacitor dielectric. Ferroelectric materials exhibit a spontaneous electric polarization that can be reversed by the application of an external electric field. In a ferroelectric material, polarization occurs in accordance with a suitable applied voltage between two electrodes, and such polarization remains after the applied voltage has been removed. The polarization can be reversed by application of a suitable inverted voltage. Each polarization state has different capacitance from the other, and which ideally can be used to store and read a memory state without reversing the polarization state until such is desired to be changed. FeRAM memory cells incorporating a ferroelectric capacitor are thereby non-volatile due to the bi-stable characteristics of the ferroelectric material that forms a part of the capacitor. Ferroelectric capacitors may also be used in integrated circuitry other than memory.

Properties associated with ferroelectric capacitors include endurance (how many programmed cycle changes can occur before device failure), retention (maintaining a programmed state without an un-programmed state change), and imprint (becoming resistive to programmed polarization reversal evidenced by a lateral shift of the hysteresis loop). Accordingly, it is desirable to have high endurance, high retention, and low imprint in ferroelectric capacitors.

DETAILED DESCRIPTION OF EXAMPLE EMBODIMENTS

Figure 1:
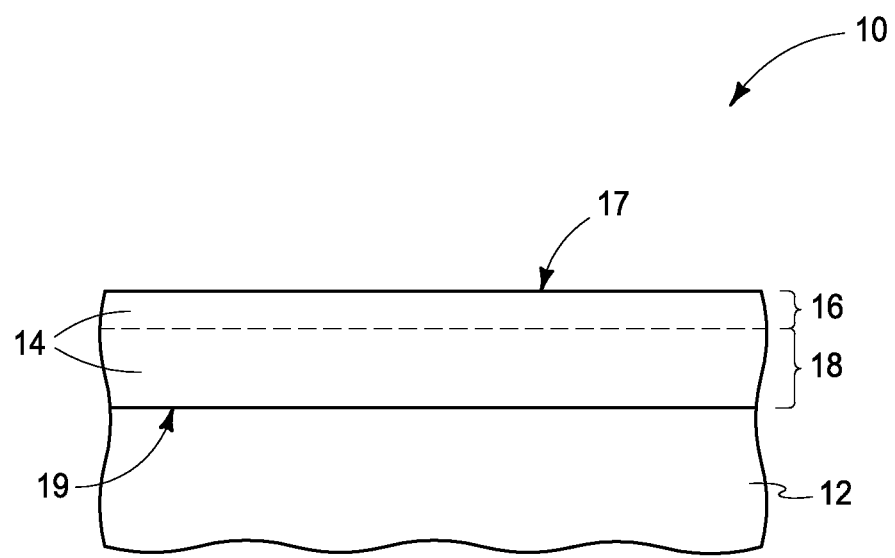
FIG. 1 is a diagrammatic sectional view of a substrate fragment in process in accordance with an embodiment of the invention.

Embodiments of the invention encompass methods of forming ferroelectric capacitors, for example as might be used in FeRAM or other integrated circuitry. Example embodiments are described with references to FIGS. 1-8. Referring to FIG. 1, an example substrate fragment 10 comprises a base substrate 12, which may be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Partially or wholly fabricated components of integrated circuitry may be formed as part of, or be elevationally inward of, substrate material 12. The depicted portion of substrate material 12 may be conductive (i.e., electrically), dielectric, and/or semiconductive. A specific example is conductively-doped semiconductive material such as monocrystalline silicon and/or polycrystalline silicon.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Inner conductive capacitor electrode material 14 has been formed over substrate 12. Such may comprise any suitable conductive material, such as elemental metals, an alloy of two or more elemental metals, conductive metal compounds, and/or conductively-doped semiconductive material. Specific example materials include TiN, TiCN, TiAlN, TiAlCN, Ti—W, Ru—TiN, and RuCN. In one embodiment, inner conductive capacitor electrode material 14 is metallic, and substrate material 12 that is directly against material 14 is devoid of metal. In the context of this document, metal means any one or more of elemental metal(s), alloy(s) of two or more elemental metals, and one or more conductive metal compounds. Metallic means containing at least ninety molar percent metal. Further, devoid of metal means from zero to no more than $10^{15}$ metal atoms per cubic centimeter if containing elemental form metal(s) or alloy(s) and metal-containing molecules per cubic centimeter if containing metal compound(s).

Inner conductive capacitor electrode material 14 may be considered as comprising an outermost region 16 having an outermost surface 17 and an innermost region 18 having an innermost surface 19. The example processing depicted in the figures is in fabrication of a horizontal capacitor, although vertical or other orientations may be used. A horizontal capacitor may be characterized by two capacitor electrodes at different elevations having the capacitor dielectric elevationally there-between. In this document, vertical is a direction generally orthogonal to horizontal, with horizontal referring to a general direction along a primary surface relative to which a substrate is processed during fabrication. Further, vertical and horizontal as used herein are generally perpendicular directions relative one another independent of orientation of the substrate in three dimensional space. Additionally, elevational, above, and below are with reference to the vertical direction. Accordingly in the depicted example, relative to material 14, region 16 comprises an elevationally outermost region and region 18 comprises an elevationally innermost region.

Outermost region 16 and innermost region 18 may be of the same composition or of different compositions relative one another, and may be un-defined or in-distinguishable from one another at least upon initial formation of conductive electrode material 14. Additionally, regions 16 and 18 may individually be of constant maximum thickness (as shown) or of varying thickness (not shown). In this document, "thickness" is defined as the mean straight-line distance through a given material or region perpendicularly from a closest surface of an immediately adjacent material of different composition or of an immediately adjacent region. Regardless, regions 16 and 18 may have the same maximum thickness (not shown) or may have different maximum thicknesses, with the thickness of region 16 being shown smaller than that of region 18. As more specific examples, an example thickness for all of inner conductive capacitor electrode material 14 is about 25 to 300 Angstroms, with an example thickness of outermost region 16 being about 5 to 20 Angstroms. In one embodiment outermost region 16 has a thickness that is no greater than about 20 Angstroms.

Figure 2:
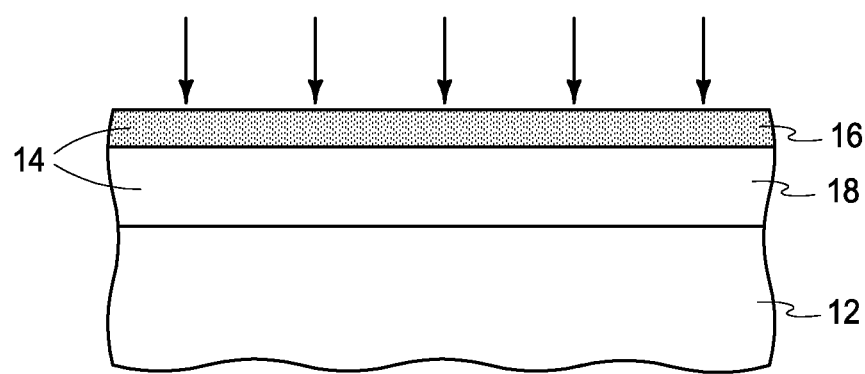
FIG. 2 is a view of the FIG. 1 substrate at a processing step subsequent to that shown by FIG. 1.

Referring to FIG. 2 and after inner electrode material 14 has been formed atop substrate material 12, outermost region 16 of inner electrode material 14 is treated to increase carbon content (i.e., in elemental, molecular, or other form) in outermost region 16 from what it was prior to the act of treating (i.e., regardless of whether any is present before such treating). Such act of treating is depicted in FIG. 2 by downwardly directed arrows. In one embodiment, outermost region 16 may be homogenous at least regarding carbon content after the treating, and in one embodiment may not be homogenous at least regarding carbon content after the treating. In one example, carbon content in outermost region 16 is about 0.01 to 10 atomic percent after the treating, and in one embodiment is about 1 to 5 atomic percent after the treating (i.e., meaning on average if not homogenous regarding carbon content). Outermost region 16 and innermost region 18 individually may have carbon content of at least 0.01 atomic percent before and after the act of treating. Alternately in one embodiment, each may individually be devoid of carbon before the treating. In this document, "devoid of carbon" means from zero carbon content up to no greater than $10^{15}$ carbon atoms (if present in elemental form) and carbon-containing molecules per cubic centimeter. The act of treating may slightly increase thickness (not shown) of the inner electrode material. Alternately, the act of treating does not increase thickness of the inner electrode material.

Figure 3:
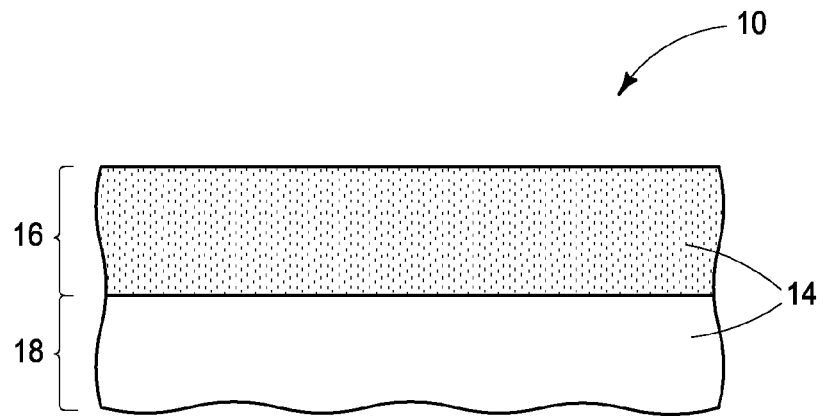
FIG. 3 is an enlargement of a portion of the FIG. 2 substrate subsequent to an act of treating shown by FIG. 2.
Figure 4:
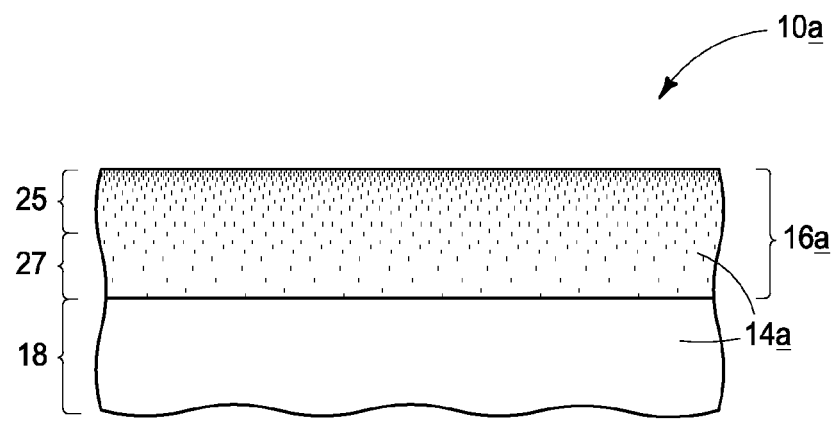
FIG. 4 is a diagrammatic sectional view of an alternate embodiment substrate fragment depicting alternate processing to that of FIG. 3.

FIG. 3 is an enlargement of an outermost portion of conductive electrode material 14 illustrating one example embodiment after the treating, and shows outermost region 16 having homogenous carbon distribution by uniform dots/stippling. FIG. 4 illustrates an alternate embodiment substrate fragment 10a to that of FIG. 3 and wherein outermost region 16a is not homogenous regarding carbon content. Like numerals from the above-described embodiments have been used where appropriate, with some differences being indicated with the suffix "a" or with a different numeral. In FIG. 4, an example outermost part 25 of outermost region 16a has greater carbon content (i.e., on average) than an innermost part 27 of outermost region 16a after the act of treating. Outermost part 25 and innermost part 27 may individually be homogenous or non-homogenous at least regarding carbon content, with non-homogeneity of carbon content being shown for each in the FIG. 4 example. Regardless, parts 25 and 27 may have the same or different maximum thickness. FIG. 4 additionally is intended to show but one example embodiment wherein carbon content is essentially linearly decreasing in concentration from outwardly to inwardly within region 16a, although other concentration gradients may be used.

Figure 5:
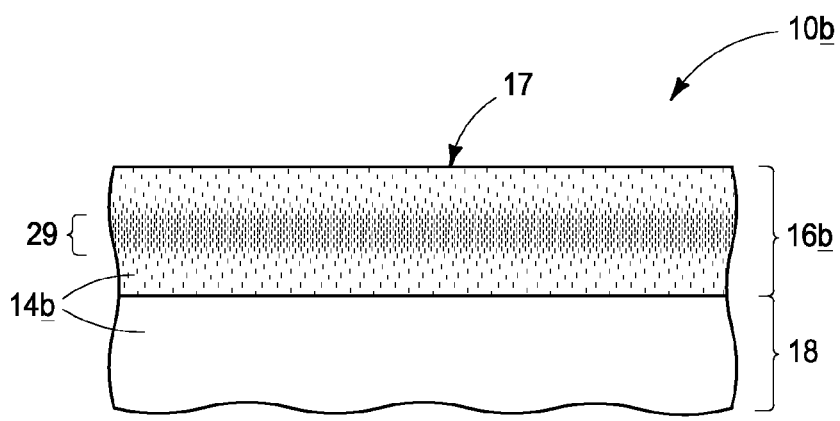
FIG. 5 is a diagrammatic sectional view of an alternate embodiment substrate fragment depicting alternate processing to that of FIGS. 3 and 4.

FIG. 5 depicts an alternate example embodiment substrate fragment 10b to that of FIGS. 3 and 4, and also where outermost region 16b is not homogenous at least regarding carbon content. Like numerals from the above-described embodiments have been used where appropriate, with some differences being indicated with the suffix "b" or with a different numeral. In FIG. 5, a region 29 of greatest carbon concentration in outermost region 16b is displaced inwardly from outermost surface 17 after the treating. Region 29 is shown as being elevationally central within outermost region 16b, although other elevational positioning may be used.

Treating may occur by one or more of any suitable existing or yet-to-be-developed manners which provide carbon into outermost region 16/16a/16b. In one embodiment, the treating comprises ion implanting carbon material (i.e., with or without plasma), and in one embodiment comprises plasma immersion ion implantation (sometimes referred to as plasma doping [PLAD]). As one example for PLAD, substrate chuck temperature may be about room temperature to 100° C., substrate chuck bias about 500 to 5,000 V, chamber pressure about 1 to 20 mTorr, plasma power about 500 to 2,000 W, and hydrocarbon (e.g., methane, $C_2H_6$, $C_2H_4$, $C_2H_2$, $C_3H_6$, etc.) flow to the chamber at about 100 to 500 sccm for about 3 minutes to one hour, for example to implant carbon-containing material at a dose of about $5 \times 10^{15}$ atoms/cm$^2$.

As another example, the treating can comprise diffusion of carbon-containing material into and through outermost surface 17 of outermost region 16/16a/16b (i.e., in the absence of ion implanting). In one embodiment, the carbon-containing material may be in plasma phase over the outermost surface during the diffusion. In one embodiment, the treating may comprise gas-phase diffusion (i.e., meaning in the absence of plasma). One such example is processing chamber temperature about 300 to 600° C., pressure about 1 mTorr to about 5 Torr, hydrocarbon flow about 250 to 300 sccm for about 3 minutes to one hour. An example treating including exposure to plasma includes substrate temperature about 275 to 550° C., pressure about 1 mTorr to about 5 Torr, an unbiased wafer chuck, plasma power about 1,000 to 2,000 W, and about 48% volumetric flow of H$_2$ and about 58% volumetric flow of C$_3$H$_6$.

Figure 6:
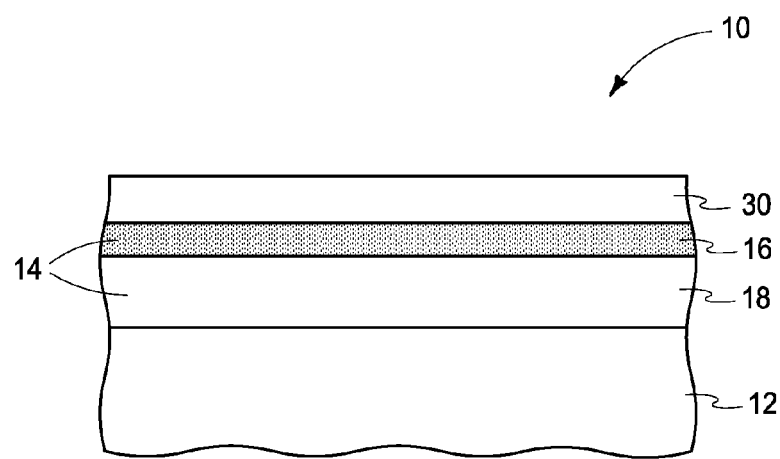
FIG. 6 is a view of the FIG. 2 substrate at a processing step subsequent to that shown by FIG. 2.
Figure 7:
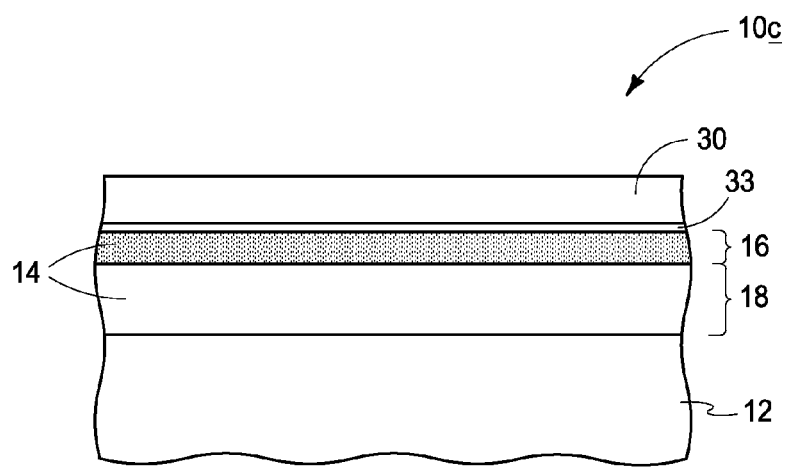
FIG. 7 is a diagrammatic sectional view of an alternate embodiment substrate fragment depicting alternate processing to that of FIG. 6.

Referring to FIG. 6, and after the act of treating, ferroelectric capacitor dielectric material 30 is formed over treated outermost region 16 of inner electrode material 14. Any suitable existing or yet-to-be-developed ferroelectric dielectric material may be used. In one embodiment, the ferroelectric capacitor dielectric material comprises one of more of transition metal oxide, zirconium, zirconium oxide, hafnium, hafnium oxide, lead zirconium titanate, tantalum oxide, and barium strontium titanate, and having dopant therein which comprises one or more of silicon, aluminum, lanthanum, yttrium, erbium, calcium, magnesium, strontium, and a rare earth element. In one embodiment, forming the ferroelectric capacitor dielectric comprises depositing an initially amorphous phase solid followed by crystalline phase transformation of the amorphous phase solid (i.e., after its deposition). By way of examples, any of the materials and processing described in U.S. Pat. No. 7,709,359 to Boescke et al. may be used, and which is herein incorporated by reference. Regardless, an example thickness for ferroelectric capacitor dielectric material 30 is about 15 to 200 Angstroms. FIG. 6 shows the forming of ferroelectric capacitor dielectric material 30 to be directly against treated outermost region 16 of inner electrode material 14. Regardless, in one embodiment, the method is devoid of forming any non-ferroelectric dielectric oxide between any of treated outermost region 16 and ferroelectric capacitor dielectric material 30 (as shown). In one embodiment, at least one of a non-ferroelectric dielectric oxide, a non-ferroelectric dielectric oxynitride, and a non-ferroelectric dielectric carbon oxynitride may form, for example as shown with respect to a substrate 10c in FIG. 7. Like numerals from the above-described embodiments have been used where appropriate, with some differences being indicated with the suffix "c" or with a different numeral. FIG. 7 shows formation of material 33 between at least some (all as shown) of outermost region 16 and ferroelectric capacitor dielectric material 30, with material 33 comprising at least one of a non-ferroelectric dielectric oxide, a non-ferroelectric dielectric oxynitride, and a non-ferroelectric dielectric carbon oxynitride. If material 33 is formed discontinuously over outermost region 16 (not shown), another some of outermost region 16 and ferroelectric capacitor dielectric material 30 may be directly against one another (not shown).

In one embodiment, outermost region 16/16a/16b is formed to comprise oxygen at least after forming ferroelectric capacitor dielectric material 30 there-over. Alternately, and in one embodiment, outermost region is formed to be devoid of oxygen at least after forming ferroelectric capacitor dielectric material 30. In this document "devoid of oxygen" means from zero to no more than $10^{15}$ oxygen atoms (whether in elemental form or in compound form) per cubic centimeter.

Ideally, little if any non-ferroelectric oxide is formed and outermost region 16/16a/16b is devoid of oxygen in accordance with one motivation of the invention, as such can have undesired adverse effects on the ferroelectric capacitor being formed. Further, embodiments of the invention may overcome some drawbacks of prior art methods of fabricating capacitors in precluding or at least reducing formation of non-ferroelectric oxide and keeping outermost region 16/16a/16b devoid of oxygen. For example, using TiN as an inner capacitor electrode material can facilitate desired crystallization of a ferroelectric capacitor dielectric material as disclosed in U.S. Pat. No. 7,709,359 to Boescke et al. when TiN is initially deposited to be amorphous. Interface of such amorphous ferroelectric material with underlying TiN can undesirably form non-ferroelectric TiO$_x$ between TiN and the ferroelectric capacitor dielectric material (e.g., material 33 in FIG. 7). Alternately or additionally, oxygen from an oxygen-containing ferroelectric capacitor dielectric material may enter the TiN, thereby forming a TiON material (independent of whether a separate TiO$_x$ layer is formed). Provision of carbon within outermost region 16/16a/16b of inner electrode material 14/14a/14b may eliminate or at least reduce formation of a metal oxide layer and/or injection of oxygen into underlying inner electrode material, thereby facilitating crystallization of such ferroelectric capacitor dielectric material and/or producing a better ferroelectric capacitor dielectric material of known or desired composition and/or properties. For example, one or more of endurance, retention, or imprint may be improved.

Figure 8:
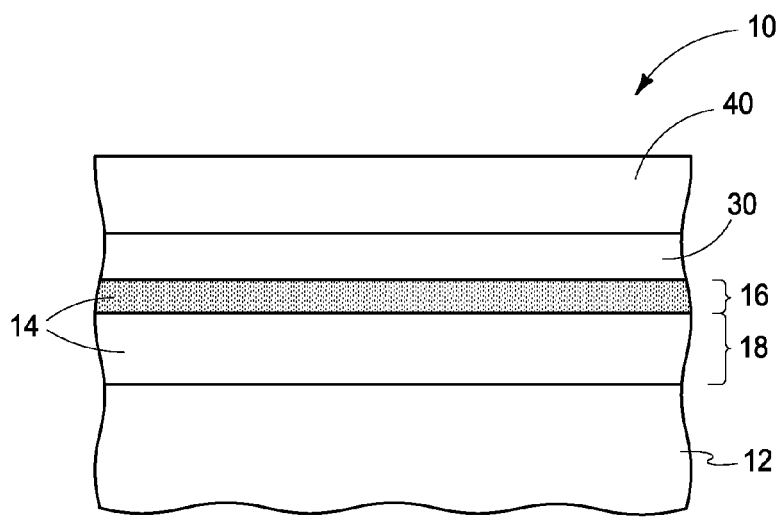
FIG. 8 is a view of the FIG. 6 substrate at a processing step subsequent to that shown by FIG. 6.

Referring to FIG. 8, outer conductive capacitor electrode material 40 has been formed over ferroelectric capacitor dielectric material 30. Example materials include those described above for inner electrode material 14, and outer electrode material 40 may be of the same composition or of different composition from that of inner material 14.

Ferroelectric capacitors fabricated in accordance with the invention may be incorporated in ferroelectric random access memory cells and in other circuitry.

CONCLUSION

In some embodiments, a method of forming a ferroelectric capacitor comprises forming inner conductive capacitor electrode material over a substrate. After forming the inner electrode material, an outermost region of the inner electrode material is treated to increase carbon content in the outermost region from what it was prior to the treating. After the treating, ferroelectric capacitor dielectric material is formed over the treated outermost region of the inner electrode material. Outer conductive capacitor electrode material is formed over the ferroelectric capacitor dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a ferroelectric capacitor, comprising:

forming inner conductive capacitor electrode material over a substrate;

after forming the inner electrode material, treating an outermost region of the inner electrode material to increase carbon content in the outermost region from what it was prior to the treating;

after the treating, forming ferroelectric capacitor dielectric material over the treated outermost region of the inner electrode material; and forming outer conductive capacitor electrode material over the ferroelectric capacitor dielectric material.

2. The method of claim 1 wherein carbon content in the outermost region is about 0.01 atomic percent to about 10 atomic percent after the treating.

3. The method of claim 2 wherein carbon content in the outermost region after the treating is about 1 atomic percent to about 5 atomic percent.

4. The method of claim 1 comprising an innermost region of the inner electrode material inward of the outermost region which extends to an innermost surface of the inner electrode material, the innermost region having carbon content of at least about 0.01 atomic percent before and after the treating.

5. The method of claim 1 comprising an innermost region of the inner electrode material inward of the outermost region which extends to an innermost surface of the inner electrode material, the innermost region being devoid of carbon before and after the treating.

6. The method of claim 1 wherein the inner electrode material is metallic and which is directly against substrate material that is devoid of metal.

7. The method of claim 6 comprising an innermost region of the inner electrode material inward of the outermost region which extends to the substrate material, the outermost region having a maximum thickness that is less than that of the innermost region.

8. The method of claim 1 wherein the outermost region is homogenous at least regarding carbon content after the treating.

9. The method of claim 1 wherein the outermost region is not homogenous at least regarding carbon content after the treating.

10. The method of claim 9 wherein an outermost part of the outermost region has greater carbon content than an innermost part of the outermost region after the treating.

11. The method of claim 9 wherein a region of greatest carbon concentration in the outermost region is displaced inwardly from an outermost surface of the outermost region after the treating, the outermost region having a thickness no greater than 20 Angstroms.

12. The method of claim 11 wherein the inner electrode material has a maximum thickness of no greater than about 300 Angstroms.

13. The method of claim 1 wherein the treating comprises ion implanting carbon material.

14. The method of claim 13 wherein the ion implanting comprises plasma.

15. The method of claim 14 wherein the treating comprises plasma immersion ion implantation.

16. The method of claim 1 wherein the treating comprises diffusion of carbon material into and through an outermost surface of the outermost region.

17. The method of claim 16 wherein the treating comprises gas phase diffusion.

18. The method of claim 16 wherein the carbon material is in plasma phase over the outermost surface during the diffusion.

19. The method of claim 1 wherein the ferroelectric capacitor dielectric material comprises one of more of transition metal oxide, zirconium, zirconium oxide, hafnium, hafnium oxide, lead zirconium titanate, tantalum oxide, and barium strontium titanate, and having dopant therein which comprises one or more of silicon, aluminum, lanthanum, yttrium, erbium, calcium, magnesium, strontium, and a rare earth element.

20. The method of claim 19 wherein forming the ferroelectric capacitor dielectric material comprises depositing an initially amorphous phase solid followed by crystalline phase transformation of the amorphous phase solid after its deposition.

21. The method of claim 19 wherein the inner electrode material comprises TiN.

22. The method of claim 1 comprising forming the ferroelectric capacitor dielectric material directly against the outermost region.

23. The method of claim 22 being devoid of forming any non-ferroelectric dielectric oxide between any of the outermost region and the ferroelectric capacitor dielectric material.

24. The method of claim 1 comprising forming at least one of a non-ferroelectric dielectric oxide, a non-ferroelectric dielectric oxynitride, and a non-ferroelectric dielectric carbon oxynitride between at least some of the outermost region and the ferroelectric capacitor dielectric material.

25. The method of claim 24 comprising forming another some of the outermost region and the ferroelectric capacitor dielectric material directly against one another.

26. The method of claim 1 comprising forming the outermost region to comprise oxygen at least after forming the ferroelectric capacitor dielectric material.

27. The method of claim 1 comprising forming the outermost region to be devoid of oxygen at least after forming the ferroelectric capacitor dielectric material.

28. The method of claim 1 comprising forming the outermost region to a maximum thickness of about 5 to 20 Angstroms.

29. The method of claim 28 comprising forming the inner electrode material to a maximum thickness of no greater than about 300 Angstroms.

30. The method of claim 1 comprising incorporating the ferroelectric capacitor in a ferroelectric random access memory cell.

* * * * *